US012595589B2

(12) United States Patent
Fero et al.

(10) Patent No.: US 12,595,589 B2
(45) Date of Patent: Apr. 7, 2026

(54) CHEMICAL VAPOR DEPOSITION REACTOR IN POLYSILICON PRODUCTION PROCESS

(71) Applicant: Advanced Material Solutions, Missoula, MT (US)

(72) Inventors: Chad Fero, Missoula, MT (US); David Keck, Missoula, MT (US)

(73) Assignee: Advanced Material Solutions, LLC

( * ) Notice: Subject to any disclaimer, the term of this patent is extended or adjusted under 35 U.S.C. 154(b) by 303 days.

(21) Appl. No.: 18/363,816

(22) Filed: Aug. 2, 2023

(65) Prior Publication Data

US 2024/0084480 A1 Mar. 14, 2024

Related U.S. Application Data

(60) Provisional application No. 63/375,308, filed on Sep. 12, 2022.

(51) Int. Cl.
*C30B 29/06* (2006.01)
*C30B 25/08* (2006.01)
*C30B 25/10* (2006.01)

(52) U.S. Cl.
CPC .............. *C30B 29/06* (2013.01); *C30B 25/08* (2013.01); *C30B 25/10* (2013.01)

(58) Field of Classification Search
CPC ....... C01B 33/035; C30B 25/08; C30B 25/10; C30B 29/06
See application file for complete search history.

(56) References Cited

U.S. PATENT DOCUMENTS

| | | | |
|---|---|---|---|
| 6,749,824 B2 | 6/2004 | Keck et al. | |
| 8,993,056 B2 | 3/2015 | Revankar et al. | |
| 10,208,381 B2 | 2/2019 | Troutman et al. | |
| 2002/0014197 A1* | 2/2002 | Keck ....................... | C23C 16/24 |
| | | | 117/200 |
| 2016/0177447 A1* | 6/2016 | Troutman ........... | C23C 16/4418 |
| | | | 118/725 |
| 2018/0229203 A1* | 8/2018 | Park ........................ | B01J 19/08 |

* cited by examiner

*Primary Examiner* — Matthew J Song
(74) *Attorney, Agent, or Firm* — NKL Law; Jae Youn Kim

(57) ABSTRACT

A chemical vapor deposition reactor that increases the yield of polysilicon in a polysilicon manufacturing process is presented in this disclosure. A chemical vapor deposition reactor may include a heat transfer jacket that protrudes at an upper end as much as or more than the top end of a filament to reflect radiant heat back to a filament or polysilicon rod. The heat transfer jacket may be used to control the temperature difference on the filament or polysilicon to prevent cracks in the polysilicon to increase the yield of the polysilicon in the polysilicon manufacturing process.

16 Claims, 6 Drawing Sheets

400

CHEMICAL VAPOR DEPOSITION REACTOR IN POLYSILICON PRODUCTION PROCESS

CROSS-REFERENCE TO RELATED APPLICATIONS

This application claims the benefit of U.S. Provisional Patent Application Ser. No. 63/375,308, filed Sep. 20, 2022. The entire contents of this application are hereby incorporated by reference herein.

BACKGROUND

Field

One or more embodiments of the present invention relate to a chemical vapor deposition reactor that increases the yield of polysilicon in a polysilicon manufacturing process, and more particularly, relate to a chemical vapor deposition reactor for polysilicon production that controls stresses due to thermo-differences in polysilicon bodies.

Description of the Related Art

Polysilicon is a source material of semiconductors or solar panels. Typically, there are a lot of methods to produce polysilicon. The "Siemens" chemical vapor deposition process is one of the most widely used polysilicon production methods. The Siemens process is the silicon growth onto electrically heated polysilicon filaments in a chemical vapor deposition reactor with a supplying reactive gas containing silicon. Silicon deposits on the filament by chemical vapor deposition, thereby growing elongated polysilicon bodies, which are better known as polysilicon rods.

The temperature of the surface of the polysilicon rod in the chemical vapor deposition reactor may not be uniform due to various causes. For example, some surfaces of the polysilicon rod have a lower temperature at a location with more radiant heat loss, but other surfaces have a higher temperature at a location from lower losses of radiant heat.

Stresses in the polysilicon rod are formed during cool down of the rods due to differences in the temperature during growth. Compounding this problem is that the center of the polysilicon rod runs at a higher temperature than the surface of the polysilicon rod. Once the growth of polysilicon is complete and the rod start to cool, the polysilicon rod shrinks and as the stresses increase, cracks can form and break the polysilicon rod. In general, since the rod or filament is U-shaped pin, the grown polysilicon rod has the same shape. Cracks tend to be observed in bend or corner portions of the polysilicon rod. Cracks facilitate the introduction of impurities onto the surface polysilicon if the polysilicon rod breaks and touches the surface of the reactor, thereby reducing efficiency of producing high-purity polysilicon. Also, cracks can propagate down the vertical portion of the polysilicon rod. Long unbroken portions of polysilicon rods are the most commercially valuable due to their length with uniform diameter. Cracks reduce the yield of vertical portions. Furthermore, differences in surface temperatures create differences in surface morphology and rod diameter. The differences in surface morphology and rod diameter will reduce the reactor productivity.

Therefore, there is a need to mitigate or control stresses caused by thermal differences in the polysilicon bodies thereby mitigating and controlling cracks produced by the stresses.

Information disclosed in this Background section was already known to the inventors of the present invention before producing the present invention or is technical information acquired in the process of producing the present invention. Therefore, it may contain information that does not form the prior art that is already known in this country to a person of ordinary skill in the art.

SUMMARY

In one or more embodiments of the present invention, there is provided a chemical vapor deposition reactor in polysilicon production process, the reactor may include at least one reaction chamber; at least one pair of electrodes extending into the at least one reaction chamber; at least one filament, wherein the at least one filament comprises a pair of vertical portions and a bridge connecting tops of the pair of vertical portions horizontally, and wherein bottoms of the pair of vertical portions are respectively connected to the at least one pair of electrodes, and wherein the at least one filament is heated by an electric current applied through the at least one pair of electrodes; and at least one heat transfer jacket surrounding the pair of vertical portions of the at least one filament, each heat transfer jacket including a double wall, wherein the double wall includes a space to contain a heat transfer medium therein, wherein a surface of the double wall facing the at least one filament includes a reflective surface reflecting radiant heat emitted from the at least one filament to the at least one filament, and wherein at least portion of an upper end of the at least one heat transfer jacket extends at least higher than a bottom of the bridge to reflect radiant heat to the at least one filament.

According to one or more embodiments, the at least one heat transfer jacket further may include a body part surrounding the pair of the vertical portions, wherein an upper part of the body part is located below the bridge; and an extension part connected the body part, wherein the extension part is disposed to face a side of the bridge, and an upper edge of the extension part is higher than the bottom of the bridge.

According to one or more embodiments of the present invention, a center angle of an arc of the extension part does not exceed 180 degrees of the body part.

According to one or more embodiments of the present invention, at least a portion of the at least one heat transfer jacket has a circular cross section.

According to one or more embodiments of the present invention, the heat transfer medium is water.

According to one or more embodiments of the present invention, the reflective surface includes one or more materials selected from with stainless steel, nickel, a nickel alloy, molybdenum, a molybdenum alloy, tungsten, a tungsten alloy, cobalt, a cobalt alloy, titanium, a titanium alloy, silver, a silver alloy, gold, a gold alloy, tantalum, a tantalum alloy, platinum and/or a platinum alloy.

According to one or more embodiments of the present invention, the reflective surface is plated with one or more materials selected from stainless steel, nickel, a nickel alloy, molybdenum, a molybdenum alloy, tungsten, a tungsten alloy, cobalt, a cobalt alloy, titanium, a titanium alloy, silver, a silver alloy, gold, a gold alloy, tantalum, a tantalum alloy, platinum and/or a platinum alloy.

According to one or more embodiments of the present invention, the at least one heat transfer jacket may further include a heat transfer medium inlet providing the heat transfer medium into the space of the double wall; and a heat transfer medium outlet discharging the heat transfer medium.

In one or more embodiments, there is provided a chemical vapor deposition reactor may include a reaction chamber; a first electrode and a second electrode, wherein the first electrode and the second electrode extend into the reaction chamber; a filament including a first vertical portion, a second vertical portion, and a bridge connecting a top of a first vertical portion to a top of the second vertical portion horizontally, wherein the first vertical portion has a bottom connected to the first electrode and the second vertical portion has a bottom connected to the second electrode, and the filament is heated by an electric current applied through the first electrode and the second electrode; and at least one heat transfer jacket surrounding both the first vertical portion and the second vertical portion of the filament and including a double wall, wherein the double wall includes a space to contain a heat transfer medium therein, wherein the double wall has a surface facing the filament, and the surface facing the filament includes a reflective surface reflecting radiant heat emitted from the filament toward the filament, wherein at least portion of an upper end of the at least one heat transfer jacket extends at least higher than a bottom of the bridge to reflect radiant heat to the filament.

As described above, according to embodiments of the present invention, the yield of polysilicon can be increased by controlling temperature differences in the polysilicon rod, thereby cracks can be controlled in the deposition of poly-silicon.

Additional aspects will be set forth in part in the description which follows and, in part, will be apparent from the description, or may be learned by practice of the presented embodiments.

BRIEF DESCRIPTION OF THE DRAWINGS

These and/or other aspects will become apparent and more readily appreciated from the following description of the embodiments, taken in conjunction with the accompanying drawings of which.

Figure 1:
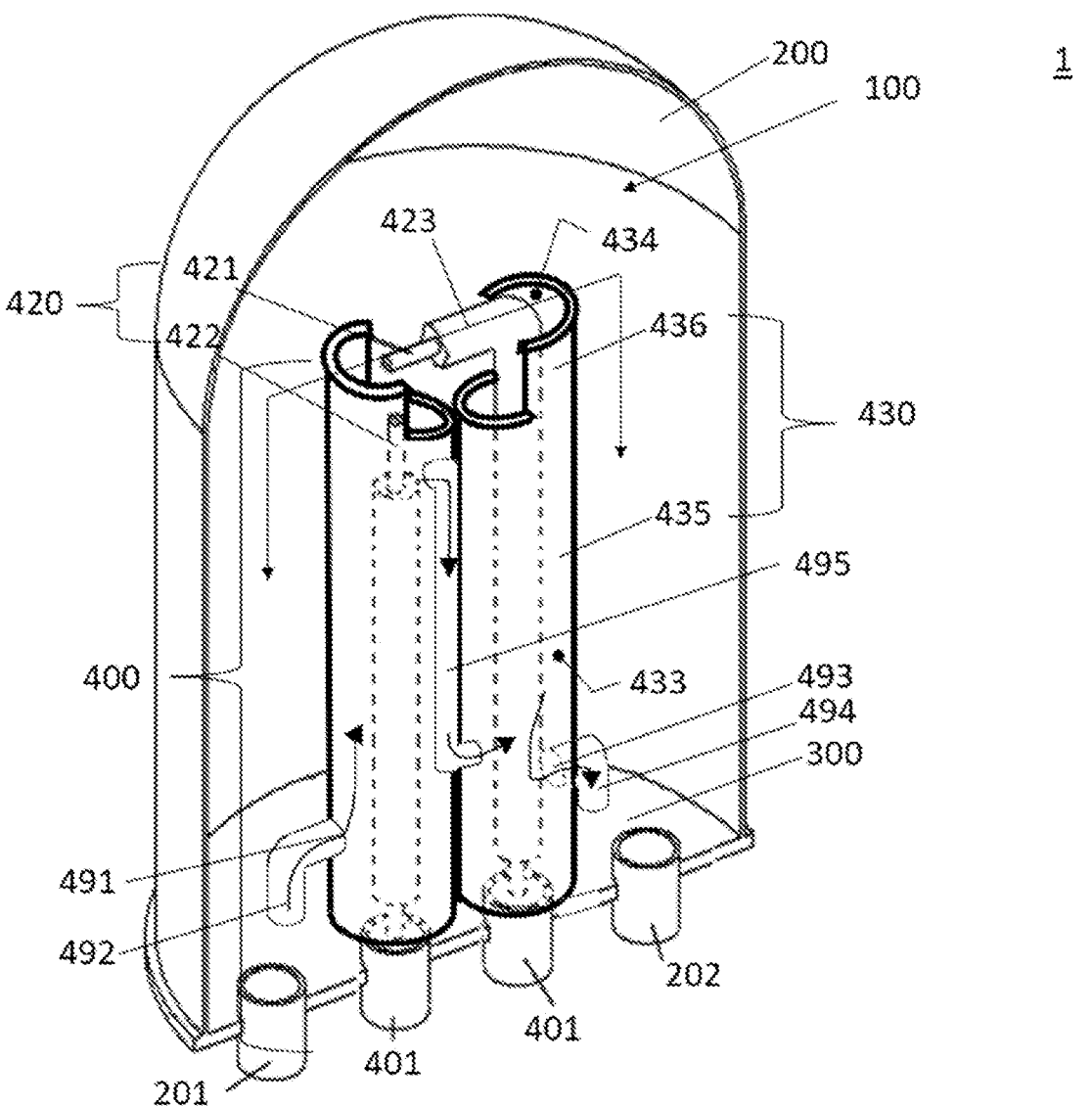
FIG. 1 is a chemical vapor deposition reactor for producing polysilicon according to an embodiment of the present invention.

In each drawing, the same components are denoted by the same reference numerals. Sizes of elements in the drawings may be exaggerated for convenience of explanation. In other words, since sizes and thicknesses of components in the drawings are arbitrarily illustrated for convenience of explanation, the following embodiments are not limited thereto.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the singular forms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

FIG. 1 is a chemical vapor deposition reactor 1 for producing polysilicon according to an embodiment of the present invention. A chemical vapor deposition reactor 1 includes at least one reaction chamber 100. The reaction chamber 100 may be partitioned through the base plate 300 and the shell 200. The chemical vapor deposition reactor 1 further includes a filament assembly 400 including an electrode 401 and a heated filament 420.

The base plate 300 may be a circular plate, and the shell 200 is connected to the upper portion of the base plate 300 to provide the reaction chamber 100.

The shell 200 may have a bell shape and may be fixed to the base plate 300 through a flange portion formed at the bottom. A sealing member (not shown) may be installed between the shell 200 and the base plate 300 to seal the reaction chamber 100 from the outside.

The base plate 300 includes a gas injection unit 201 for supplying a reaction gas from a silicon-containing gas source (not shown) into the reaction chamber 100. The reaction gas may include, for example, monosilane ($SiH_4$) or disilane ($Si_2H_6$) as a silicon-containing gas. The supplied reaction gas is decomposed in contact with the heated filament 420 and then deposited as polysilicon on the surface of the filament 420 to form a polysilicon rod 423. The location and shape of the gas injection unit 201 may vary and it is not limited to that shown in the drawings.

The base plate 300 may have a discharge port 202. Byproducts, unreacted gas or fine powder in the reaction chamber 100 are discharged to the outside through the discharge port 202. The location and shape of the discharge port 202 may vary and it is not limited to that shown in the drawings.

As discussed above, the chemical vapor deposition reactor 1 includes a filament assembly 400, which includes the electrode 401 and the filament 420.

The filament 420 is a high-purity silicon slim rod. The filament 420 includes a pair of vertical portions 422 and a bridge 421 connecting them. A part connecting each of the vertical portions 422 and the bridge 421 is mainly bent and curved. The filament 420 is fixed to a chuck (not shown) and is erected in an inverted U-shape. The filament 420 may have various diameters or lengths. A reaction gas, which will be explained later, is reacted and deposited on the filament 420, thereby generating grown polysilicon rod 423.

The electrode 401 may be installed through the base plate 300. The filament 420 is connected to the electrode 401 through a chuck (not shown). The electrode 401 may be connected to a separate power supply unit (not shown). The filament 420 may be heated up to a polysilicon deposition temperature by applying a current to the filament 420 through the electrode 401. The filament 420 may be heated in the range of about 600° C. to about 1200° C. The filament 420 provides an initial deposition surface for polysilicon deposition. Thereafter, an outer surface of the deposited polysilicon serves as the deposition surface. At this time, the deposition surface may be maintained between about 800° C. and about 900° C. when using silane as the silicon gas source.

The filament assembly 400 further includes a heat transfer jacket 430. The heat transfer jacket 430 is installed in parallel with the filament 420 to surround its vertical portion 422. The cross section of the heat transfer jacket 430 may be a circle. For example, the heat transfer jacket 430 may have a cylindrical shape as shown in FIG. 1. However, the shape of the heat transfer jacket 430 is not limited to a cylinder and may have various shapes including a polygonal column.

The heat transfer jacket 430 has a double wall (shown in FIG. 2) to contain the heat transfer medium therein. The heat transfer jacket 430 includes a heat transfer medium inlet 491 for providing the heat transfer medium in a space of the double wall and a heat transfer medium outlet 493 for discharging the heat transfer medium circulating through the heat transfer jacket 430. A heat transfer medium supply line 492 is connected to the heat transfer medium inlet 491 to supply the heat transfer medium into the space of the double wall of the heat transfer jacket 430. The heat transfer medium supply line 492 may pass through the base plate 300 and be connected to a heat transfer medium supply source (not shown). A heat transfer medium discharge line 494 is connected to the heat transfer medium outlet 493 to discharge the heat transfer medium from the space of the double wall of the heat transfer jacket. The heat transfer medium discharge line 494 may pass through the base plate 300 to discharge the heat transfer medium to the outside or return it to the heat transfer medium supply source (not shown). A connector 495 connects the space of the double wall of the plurality of adjacent heat transfer jackets. The heat transfer medium circulated through the space of the double wall of one heat transfer jacket (left side heat transfer jacket in FIG. 1) may move to the space of the double wall of the next heat transfer jacket (right side heat transfer jacket in FIG. 1) through the connector 495. The flow path of the medium is shown in FIG. 1 as arrows. Meanwhile, in FIGS. 2 to 4, the heat transfer medium inlet 491, the heat transfer medium supply line 492, the heat transfer medium outlet 493 and the heat transfer medium discharge line 494 are excluded for convenience of description. The positions, locations, numbers and shapes of the heat transfer medium inlet 491, the heat transfer medium supply line 492, the heat transfer medium outlet 493 and the heat transfer medium discharge line 494 shown in FIG. 1 may be exemplary embodiments and may be modified in various ways.

The heat transfer medium is supplied to the heat transfer jacket 430 to cool the heat transfer jacket 430. The temperature of the heat transfer medium can be between about 20° C. and about 60° C. The heat transfer medium may be liquid or gas. For example, the heat transfer medium can be cooling water to achieve economical and efficiency benefit. The heat transfer jacket 430 prevents overheating in the reaction chamber 100 to prohibit the formation of unwanted byproducts due to an excessively high temperature in the reaction chamber 100.

For example, when monosilane gas is decomposed at a high temperature, fine silicon powder is generated. The silicon powder not only hinders the growth of the polysilicon rod 423, but can also cause surface unevenness of the polysilicon rod 423. The silicon powder is deposited on the surface of the heat transfer jacket 430 or the shell 200, and then the deposited silicon powder can be separated from the surface and fall from the surface. A part of the fallen silicon powder can be attached to the surface of the polysilicon rod 423. Some of the silicon powder attached to the polysilicon rod 423 may cause abnormal dendrite growth and cause product defects. This phenomenon occurs more easily in reactive gases containing silicon in the form of non-halogenated silane compounds such as monosilane ($SiH_4$), disilane ($Si_2H_6$) or their compounds. The heat transfer jacket 430 prevents the inside of the reaction chamber 100 from rising to an excessively high temperature, thereby suppressing the generation of excessive silicon powder.

Meanwhile, when the silicon powder is circulated in the reaction chamber 100, most of the silicon powder is deposited on the low temperature surfaces. Therefore, cooling the heat transfer jacket 430 not only reduces the temperature withing the reaction chamber 100, but allows the silicon powder to adhere to the surfaces of the heat transfer jacket.

Among the double walls of the heat transfer jacket, the outside (exterior) surface of the wall facing the filament 420 and/or polysilicon rod 423 is formed of a reflective surface 434 that reflects back at least a portion of the radiant heat emitted from the filament 420 and/or polysilicon rod 423 to the filament 420 and/or polysilicon rod 423. The reflective surface 434 is made of or coated with a material having good reflection efficiency of radiant heat. For example, the reflective surface 434 is constructed of or plated with at least one material selected from stainless steel, nickel, a nickel alloy, molybdenum, a molybdenum alloy, tungsten, a tungsten alloy, cobalt, a cobalt alloy, titanium, a titanium alloy, silver, a silver alloy, gold, a gold alloy, tantalum, a tantalum alloys, platinum, and/or a platinum alloy. The reflective surface 434 may reflect at least a portion of radiant heat generated from the heated filament 420 to help the filament 420 and/or polysilicon rod 423 increase in temperature and maintain a high deposition temperature. Through this, the reaction gas may be deposited on the surface of the filament 420 and/or polysilicon rod 423.

On the other hand, among the double walls of the heat transfer jacket, the outside (exterior) surface of the wall 433 facing the shell 200 is not coated with the material having good reflection efficiency of radiant heat.

Figure 2:
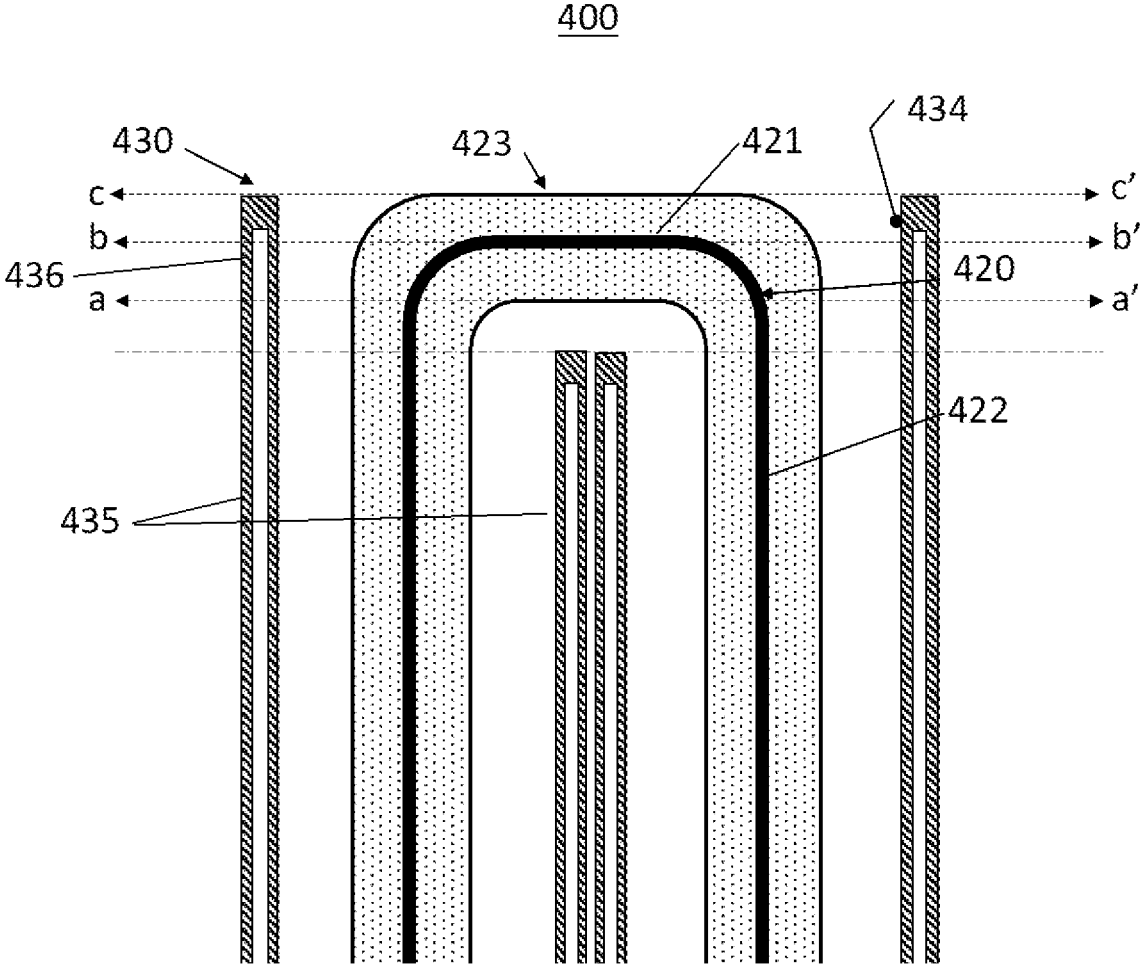
FIG. 2 is a cross-sectional enlarged view of the filament assembly of FIG. 1.
Figure 3:
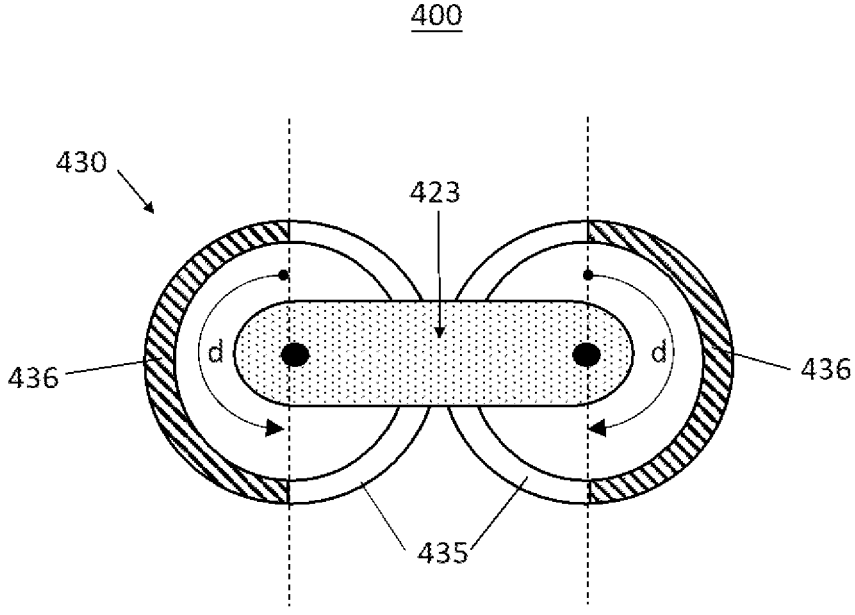
FIG. 3 is a plan view of the filament assembly of FIG. 1.
Figure 4:
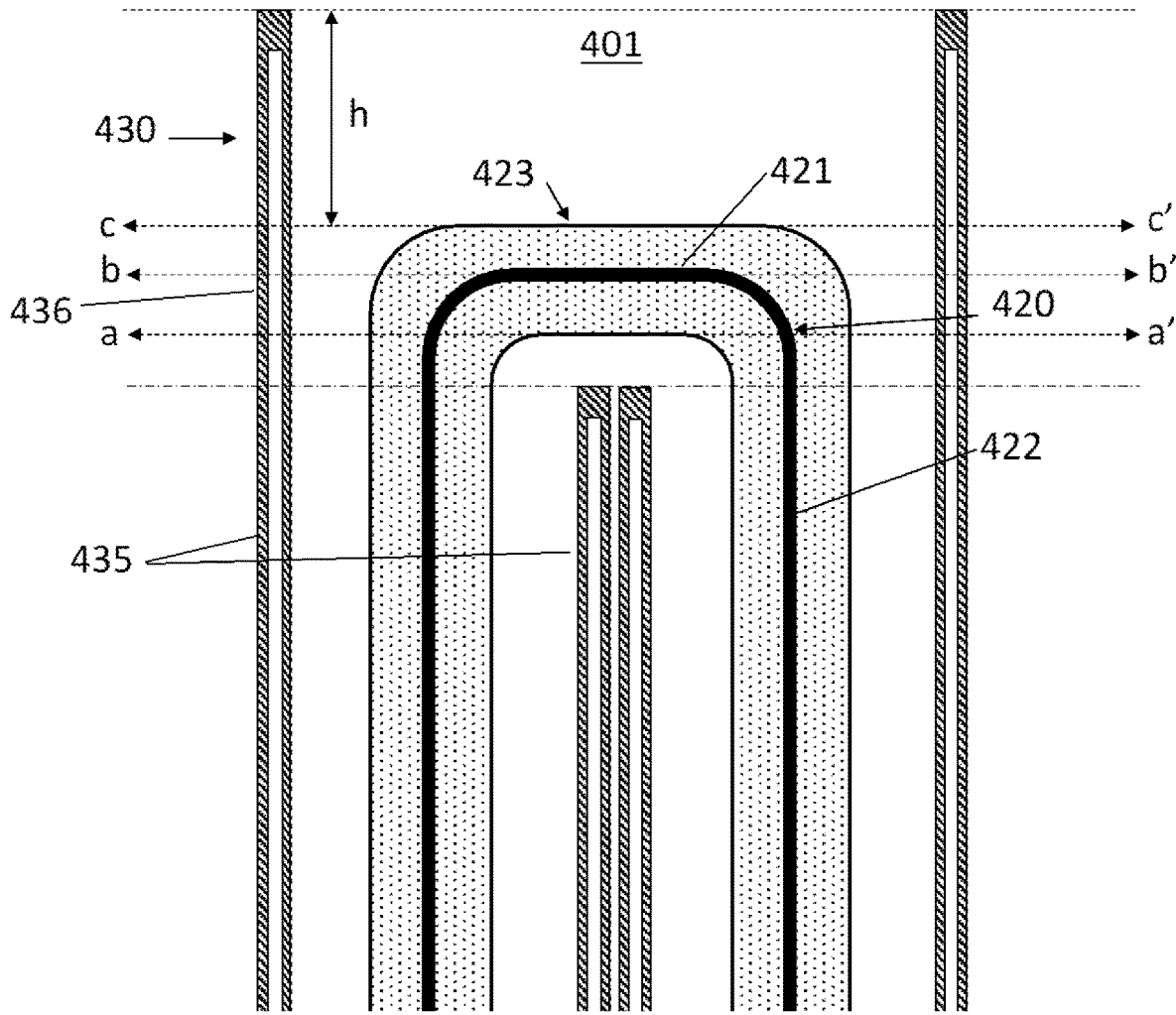
FIG. 4 is a cross-sectional enlarged view of a filament assembly of a chemical vapor deposition reactor for producing polysilicon according to another embodiment of the present invention.

FIG. 2 is a cross-sectional enlarged view of the filament assembly 400 of FIG. 1. FIG. 3 is a plan view of the filament assembly 400 of FIG. 1. Meanwhile, FIG. 4 is a cross-sectional enlarged view of another filament assembly 401 according to an embodiment different from FIG. 2.

As shown in FIG. 2, the heat transfer jacket 430 includes a body part 435 and an extension part 436. The body part 435 and the extension part 436 are names of parts divided for convenience of explanation. As we described before, the body part 435 and the extension part 436 are connected to form one heat transfer jacket 430. Accordingly, the extension part 436 also includes the double wall to circulates the heat transfer medium between them, and includes a reflective surface 434 on the outside (exterior) surface of the double wall facing the filament 420.

The body part 435 surrounds the vertical portion 422 of the filament or polysilicon rod, and the upper end of the body part 435 is positioned lower than the bridge as shown in FIG. 2.

The extension part 436, which is connected to the body part 435, is disposed to surround only the opposite side extending to the bridge as shown FIG. 3. Since the polysilicon rod 423 is heated up by the flow of current, it has conductivity, and thus an electrical problem may occur if the extension part 436 and the polysilicon rod 423 are positioned too close to each other or come into contact with each other. Accordingly, the extension part 436 does not exceed half of the center of the cross section of the body part 435 as shown in FIG. 3 in order to prevent excessive close to the bridge or contact with the bridge. For example, as shown in FIG. 3, the angle 'd' of between both edges of the extension part 436 with respect to the center of the cross-section of the body part 435 may be 180 degrees. If the angle 'd' exceeds 180 degrees, the heat transfer jacket 430 and the polysilicon rod 423 may be too close to each other, and an electrical problem may occur especially if the rod is tilted. If the angle 'd' is less than 180 degrees, more heat loss of the polysilicon rod 423 may occur.

The upper end of the extension part 436 may be positioned at least higher than the bottom of the bridge of the polysilicon rod 423 to reflect radiant heat to the filament or polysilicon rod. For example, the upper end of extension part 436 may be positioned on or above the line a-a' in FIG. 2. According to the one of the embodiments of the present invention, the upper end of the extension part 436 is positioned at the same height as the top of the bridge 421 of the filament or higher than the top of the bridge 421 of the filament. For example, the upper end of extension part 436 may be positioned on or above the line b-b' in FIG. 2. According to the other embodiments of the present invention, the upper end of the extension part 436 is positioned at the same height as the top of the bridge of the polysilicon rod 423 as shown in FIG. 2 or higher as height 'h' than the top of the bridge of the polysilicon rod 423 as shown in FIG. 4. The height 'h' may be variously changed by level of ordinary skill and is not limited to that shown in the drawings. For example, the upper end of extension part 436 may be positioned on or above the line c-c' in FIGS. 2 and 4. According to an exemplary embodiment, the upper end of extension part 436 is higher than the top of the bridge of the polysilicon rod 423 which is the line c-c' in FIG. 4, and the height 'h' may be equal to or less than twice the diameter of the polysilicon body 423. This is because the portion where the height 'h' is greater than twice the diameter of the polysilicon body 423 receives less radiant heat generated from the heated filament 420.

Figure 5A:
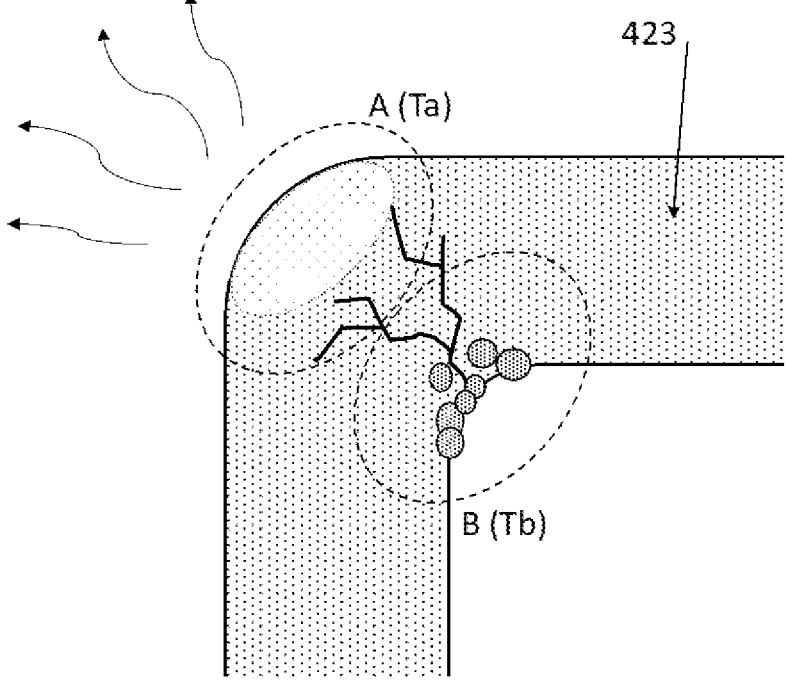
FIGS. 5A and 5B are diagrams schematically comparing polysilicon bodies with and without an extension in the enlarged view of the filament assembly of FIG. 1.
Figure 5B:
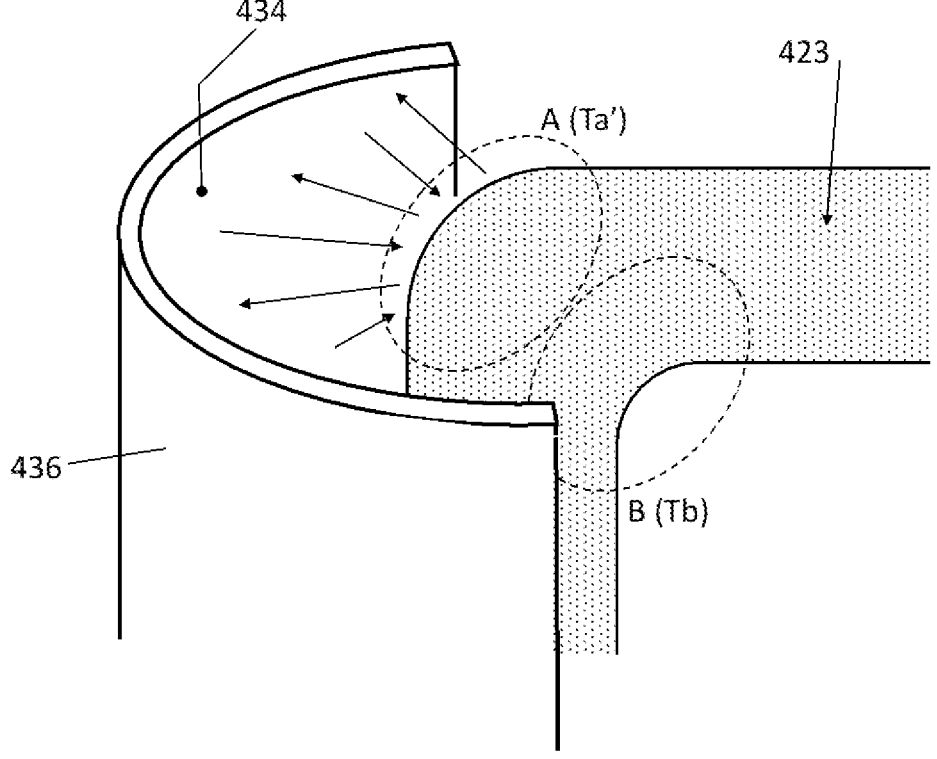

FIGS. 5A and 5B are diagrams schematically illustrating the heat transfer jacket 430 with and without the extension part 436. FIG. 5A is a prior art diagram schematically showing cracks in the polysilicon rod 423 when the extension part 436 does not exist. On the other hand, FIG. 5B is a schematic showing representation of the ideal polysilicon rod 423 when the extension part 436 is present.

As shown in FIG. 5A, if there is no extension part, part A cannot receive radiant heat by the reflective surface and a lot of heat is lost to the reaction chamber. Therefore, part A has a relatively low temperature (Ta). Polysilicon may not be properly deposited in part A as it has relatively low temperature. On the contrary, part B has a high temperature (Tb) due to overheating at the corner point where the heated vertical part and the bridge meet closely. Part B is overheated and a popcorn-shaped defect may occur. Due to temperature difference between Ta and Tb ($|Ta-Tb|$), the coefficients of thermal expansion are different in parts A and B, and stresses are accumulated in parts A and B. After the polysilicon growth is completed, when the rod starts to cool, the accumulated stresses begin to appear as cracks. Cracks may begin to appear at corner and propagate down the vertical portion. Cracks reduce the yield of vertical portions as the vertical portions are the most commercially valuable parts with a uniform diameter over their length. In addition, cracks facilitate to introduce impurities into the polysilicon, thereby lowering the efficiency of production of high-purity polysilicon.

However, as shown in FIG. 5B, the extension part 436 including the reflective surface 434 reflects the radiant heat generated from the rod 423 back to the upper portion of the rod 423, in particular, to the portion where the vertical portion and the bridge are connected. The extension part 436 may maintain the high temperature (Ta') in the part A by reflecting the radiant heat back to the part A. As described above, according to the one or more of the above embodiments of the present invention, there is no large temperature difference between parts A and B ($|Ta'-Tb| \ll |Ta-Tb|$). As a result, when the rods cool down, there are only small stresses since these temperature differences are small. Given the smaller stresses, fewer or no cracks will appear in the polysilicon. The yield of vertical portions with high commercial value is improved, and contamination due to cracks decreases, so polysilicon of high purity can be obtained.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

The invention claimed is:

1. A chemical vapor deposition reactor in a polysilicon production process, the reactor comprising:
   at least one reaction chamber;
   at least one pair of electrodes extending into the at least one reaction chamber;
   at least one filament, wherein the at least one filament comprises a pair of vertical portions and a bridge connecting tops of the pair of vertical portions horizontally, and wherein bottoms of the pair of vertical portions are respectively connected to the at least one pair of electrodes, and wherein the at least one filament is heated by an electric current applied through the at least one pair of electrodes; and
   at least one heat transfer jacket surrounding the pair of vertical portions of the at least one filament, each heat transfer jacket including a double wall, wherein the double wall includes a space to contain a heat transfer medium therein,
   wherein a surface of the double wall facing the at least one filament includes a reflective surface reflecting radiant heat emitted from the at least one filament to the at least one filament, and
   wherein at least a portion of an upper end of the at least one heat transfer jacket extends at least higher than a bottom of the bridge to reflect radiant heat to the at least one filament, and another portion of the upper end of the same at least one heat transfer jacket is located below the bridge.

2. The chemical vapor deposition reactor of claim 1, wherein the at least one heat transfer jacket further comprises:
   a body part surrounding the pair of vertical portions, wherein an upper part of the body part is located below the bridge; and
   an extension part connected to the body part, wherein the extension part is disposed to face a side of the bridge, and an upper edge of the extension part is higher than the bottom of the bridge.

3. The chemical vapor deposition reactor of claim 2, wherein a center angle of an arc of the extension part does not exceed 180 degrees of the body part.

4. The chemical vapor deposition reactor of claim 1, wherein at least a portion of the at least one heat transfer jacket has a circular cross section.

5. The chemical vapor deposition reactor of claim 1, wherein the heat transfer medium is water.

6. The chemical vapor deposition reactor of claim 1, wherein the reflective surface comprises one or more materials selected from stainless steel, nickel, a nickel alloy, molybdenum, a molybdenum alloy, tungsten, a tungsten alloy, cobalt, a cobalt alloy, titanium, a titanium alloy, silver, a silver alloy, gold, a gold alloy, tantalum, a tantalum alloys, platinum, or a platinum alloy.

7. The chemical vapor deposition reactor of claim 1, wherein the reflective surface is plated with one or more materials selected from stainless steel, nickel, a nickel alloy, molybdenum, a molybdenum alloy, tungsten, a tungsten alloy, cobalt, a cobalt alloy, titanium, a titanium alloy, silver, a silver alloy, gold, a gold alloy, tantalum, a tantalum alloys, platinum, or a platinum alloy.

8. The chemical vapor deposition reactor of claim 1, wherein the at least one heat transfer jacket further comprises:

a heat transfer medium inlet providing the heat transfer medium into the space of the double wall; and a heat transfer medium outlet discharging the heat transfer medium.

9. A chemical vapor deposition reactor comprising:

a reaction chamber;

a first electrode and a second electrode, wherein the first electrode and the second electrode extend into the reaction chamber;

a filament including a first vertical portion, a second vertical portion, and a bridge connecting a top of a first vertical portion to a top of the second vertical portion horizontally, wherein the first vertical portion has a bottom connected to the first electrode and the second vertical portion has a bottom connected to the second electrode, and the filament is heated by an electric current applied through the first electrode and the second electrode; and at least one heat transfer jacket surrounding both the first vertical portion and the second vertical portion of the filament and including a double wall, wherein the double wall includes a space to contain a heat transfer medium therein, wherein the double wall has a surface facing the filament, and the surface facing the filament includes a reflective surface reflecting radiant heat emitted from the filament toward the filament, wherein at least a portion of an upper end of the at least one heat transfer jacket extends at least higher than a bottom of the bridge to reflect radiant heat to the filament, and another portion of the upper end of the same at least one heat transfer jacket is located below the bridge.

10. The chemical vapor deposition reactor of claim 9, wherein the at least one heat transfer jacket further comprises:

a body part surrounding the first vertical portion and the second vertical portion, wherein an upper part of the body part is located below the bridge; and an extension part connected to the body part, wherein the extension part is disposed to face an outer side of the bridge, and an upper edge of the extension part is higher than the bottom of the bridge.

11. The chemical vapor deposition reactor of claim 10, wherein a center angle of an arc of the extension part does not exceed 180 degrees of the body part.

12. The chemical vapor deposition reactor of claim 9, wherein at least a portion of the at least one heat transfer jacket has a circular cross section.

13. The chemical vapor deposition reactor of claim 9, wherein the heat transfer medium is water.

14. The chemical vapor deposition reactor of claim 9, wherein the reflective surface comprises one or more materials selected from stainless steel, nickel, a nickel alloy, molybdenum, a molybdenum alloy, tungsten, a tungsten alloy, cobalt, a cobalt alloy, titanium, a titanium alloy, silver, a silver alloy, gold, a gold alloy, tantalum, a tantalum alloys, platinum, or a platinum alloy.

15. The chemical vapor deposition reactor of claim 9, wherein the reflective surface is plated with one or more materials selected from stainless steel, nickel, a nickel alloy, molybdenum, a molybdenum alloy, tungsten, a tungsten alloy, cobalt, a cobalt alloy, titanium, a titanium alloy, silver, a silver alloy, gold, a gold alloy, tantalum, a tantalum alloys, platinum, or a platinum alloy.

16. The chemical vapor deposition reactor of claim 9, wherein the at least one heat transfer jacket further comprises:

a heat transfer medium inlet providing the heat transfer medium into the space of the double wall; and a heat transfer medium outlet discharging the heat transfer medium.

* * * * *